(12) United States Patent
Kim et al.

(10) Patent No.: US 12,272,299 B1
(45) Date of Patent: Apr. 8, 2025

(54) COMPACT MEMORY-IN-PIXEL DISPLAY STRUCTURE

(71) Applicant: GlobalFoundries U.S. Inc., Malta, NY (US)

(72) Inventors: Juhan Kim, Santa Clara, CA (US); Sanjay Raj Parihar, Austin, TX (US); Mahbub Rashed, Cupertino, CA (US); Zahir Yilmaz Alpaslan, San Marcos, CA (US)

(73) Assignee: GlobalFoundries U.S. Inc., Malta, NY (US)

( * ) Notice: Subject to any disclaimer, the term of this patent is extended or adjusted under 35 U.S.C. 154(b) by 0 days.

(21) Appl. No.: 18/482,114

(22) Filed: Oct. 6, 2023

(51) Int. Cl.
G09G 3/32 (2016.01)
G11C 11/419 (2006.01)
H10B 10/00 (2023.01)

(52) U.S. Cl.
CPC ............. *G09G 3/32* (2013.01); *G11C 11/419* (2013.01); *H10B 10/12* (2023.02); *H10B 10/18* (2023.02); *G09G 2300/0439* (2013.01); *G09G 2300/0814* (2013.01); *G09G 2300/0857* (2013.01); *G09G 2310/08* (2013.01)

(58) Field of Classification Search
CPC ............. G09G 3/32; G09G 2300/0439; G09G 2300/0814; G09G 2300/0857; G09G 2310/08; H10B 10/12; H10B 10/18; G11C 11/419

See application file for complete search history.

(56) References Cited

U.S. PATENT DOCUMENTS

| 6,218,895 B1* | 4/2001 | De ..................... H03K 19/0948 |
| | | 327/566 |
| 8,969,966 B2 | 3/2015 | Cheng et al. |
| 10,163,934 B2 | 12/2018 | Hook et al. |
| 10,395,588 B2 | 8/2019 | Ahmed et al. |
| 10,510,384 B2* | 12/2019 | Bringivijayaraghavan ................. |
| | | G11C 11/419 |
| 10,777,558 B1* | 9/2020 | Kim .................... H01L 27/1203 |

(Continued)

OTHER PUBLICATIONS

U.S. Appl. No. 18/482,107 Application as filed Oct. 6, 2023, 40 pages.

(Continued)

*Primary Examiner* — Ariel A Balaoing
(74) *Attorney, Agent, or Firm* — David Cain; Hoffman Warnick LLC

(57) ABSTRACT

Disclosed are a pixel and a compact memory-in-pixel display (e.g., implemented in a fully-depleted semiconductor-on-insulator processing technology platform). A block of electronic components for a pixel includes a memory cell array, a driving circuit for an LED, and a logic circuit connected between the memory cell array and driving circuit. The memory cell array is above a Pwell, the driving circuit is above an adjacent Nwell, and the logic circuit includes P-type transistors on the Nwell and N-type transistors on the Pwell. A pixel array is above alternating P and N wells with a single buried Nwell below. Specifically, each column of pixels is above adjacent elongated P and N wells and, within each column, adjacent pixels have mirrored layouts. Furthermore, adjacent columns of pixels are above two elongated wells of one type and a shared elongated well of the opposite type therebetween and the adjacent columns have mirrored layouts.

20 Claims, 9 Drawing Sheets

| Pwell 151 | LVT/SLVT PFETs RVT/HVT NFETs | If 0.0V<VPW≤VNW≤VDD, PFETs are RBB and NFETs are FBB<br><br>If VPW=0.0V, PFETs are FBB and NFETs are RBB |
|---|---|---|
| Nwell 152 | RVT/HVT PFETs LVT/SLVT NFETs | If 0.0V<VNW≤VDD, PFETs are RBB and NFETs are FBB |

(56) References Cited

U.S. PATENT DOCUMENTS

| | | | |
|---|---|---|---|
| 11,004,878 B2* | 5/2021 | Stamper | H01L 29/165 |
| 11,049,448 B2 | 6/2021 | Knez et al. | |
| 11,069,402 B1* | 7/2021 | Jaiswal | G11C 16/0408 |
| 12,035,061 B2* | 7/2024 | Yamazaki | H01L 27/14612 |
| 2001/0005159 A1* | 6/2001 | Matsumoto | H01L 27/0629 |
| | | | 327/536 |
| 2005/0116261 A1* | 6/2005 | Van Der Zaag | G11C 11/16 |
| | | | 257/232 |
| 2005/0157539 A1* | 7/2005 | Van Der Zaag | G11C 14/0081 |
| | | | 365/158 |
| 2012/0001241 A1* | 1/2012 | Park | H01L 27/14689 |
| | | | 257/292 |
| 2012/0008031 A1* | 1/2012 | Yamashita | H04N 25/771 |
| | | | 348/E5.091 |
| 2012/0292705 A1* | 11/2012 | Cheng | H01L 27/1203 |
| | | | 257/351 |
| 2012/0306081 A1* | 12/2012 | Ishizaki | H10B 63/80 |
| | | | 438/643 |
| 2012/0313197 A1* | 12/2012 | Chen | H01L 27/14616 |
| | | | 257/431 |
| 2013/0065366 A1 | 3/2013 | Thomas et al. | |
| 2014/0312423 A1 | 10/2014 | Cheng et al. | |
| 2014/0334227 A1* | 11/2014 | Ueda | G11C 13/0007 |
| | | | 257/43 |
| 2017/0324385 A1 | 11/2017 | McKay | |
| 2017/0338274 A1* | 11/2017 | Gancarz | G01S 17/894 |
| 2019/0114987 A1 | 4/2019 | Li et al. | |
| 2020/0295004 A1 | 9/2020 | Kim | |
| 2021/0264973 A1* | 8/2021 | Jaiswal | G11C 13/0004 |
| 2022/0198995 A1* | 6/2022 | Ahmed | H01L 29/7869 |
| 2023/0029501 A1 | 2/2023 | Wang et al. | |
| 2023/0163134 A1 | 5/2023 | Jain et al. | |

OTHER PUBLICATIONS

European Search Report for related EP Application No. 24168619.5-1001 dated Sep. 18, 2024, 6 pages.

European Search Report for corresponding EP Application No. 24168621.1-1211 dated Dec. 2, 2024, 11 pages.

* cited by examiner

| | |
|---|---|
| Pwell 151 | LVT/SLVT PFETs<br>RVT/HVT NFETs | If 0.0V<VPW≤VDD, PFETs are RBB and NFETs are FBB<br><br>If VPW=0.0V, PFETs are FBB and NFETs are RBB |
| Nwell 152 | RVT/HVT PFETs<br>LVT/SLVT NFETs | If 0.0V<VNW≤VDD, PFETs are RBB and NFETs are FBB |

COMPACT MEMORY-IN-PIXEL DISPLAY STRUCTURE

BACKGROUND

The present disclosure relates to memory-in-pixel displays and, more particularly, to embodiments of a compact memory-in-pixel display structure.

Within memory-in-pixel displays, each pixel includes a light emitting diode (LED) (e.g., an ultra-LED (uLED), an embedded memory that stores data, and logic circuitry connecting the embedded memory and the LED. The use of embedded memory provides significant power savings. However, for full grayscale resolution, a relatively large number of memory cells (also referred to herein as bitcells) per pixel is required. For example, each pixel may require an array of up to twelve static random access memory (SRAM) cells or even more, thereby increasing per pixel area consumption and making target area specifications for a competitive product difficult to meet.

SUMMARY

Disclosed herein are embodiments of a structure (e.g., a block of electronic components for a pixel). The block can include an array of memory cells on an insulator layer over a Pwell in a semiconductor substrate. The structure can further include a light emitting diode (LED) driving circuit on the insulator layer over an Nwell in the semiconductor substrate. The Nwell can be positioned laterally adjacent to the Pwell and the LED driving circuit can be connected to an anode of an LED. The structure can further include a logic circuit on the insulator layer and connected to the array of the memory cells and the LED driving circuit. This logic circuit can include P-type transistors on the insulator layer over the Nwell and N-type transistors on the insulator layer over the Pwell.

Also disclosed herein are embodiments of a structure (e.g., a memory-in-pixel display structure). The structure can include a semiconductor substrate. The substrate can include, within the semiconductor substrate, a Pwell and an Nwell positioned laterally adjacent to the Pwell. The structure can include an insulator layer on the semiconductor substrate over the Pwell and the Nwell. The structure can further include multiple blocks of electronic components for multiple pixels, respectively (e.g., at least a column of blocks of electronic components for a column of pixels). Each block of electronic components for a pixel can include an array of memory cells on the insulator layer over the Pwell. Each block can further include an LED driving circuit on the insulator layer over the Nwell and connected to an anode of an LED. Each block can further include a logic circuit on the insulator layer and connected to the array of the memory cells and the LED driving circuit. This logic circuit can include P-type transistors on the insulator layer over the Nwell and N-type transistors on insulator layer over the Pwell.

In some embodiments, the memory-in-pixel display structure can include a semiconductor substrate with alternating Pwells and Nwells. The structure can include an insulator layer on the semiconductor substrate over the alternating Pwells and Nwells. The structure can further include an array of blocks of electronic components for an array of pixels. The array of blocks of electronic components can include at least two columns of the blocks of electronic components for at least two columns of pixels. The two columns of blocks of electronic components can have mirrored column layouts aligned over two wells of one type conductivity and a shared well of an opposite type conductivity therebetween (e.g., a Pwell between Nwells or an Nwell between Pwells). In any case, each block of electronic components for a pixel can include an array of memory cells on the insulator layer over one Pwell. Each block can include an LED driving circuit on the insulator layer over an Nwell adjacent to the Pwell and connected to an anode of an LED. Each block can also include a logic circuit on the insulator layer and connected to the array of the memory cells and the LED driving circuit. This logic circuit can include P-type transistors on the insulator layer over the same Nwell as the LED driving circuit and N-type transistors on insulator layer over the same Pwell as the array of memory cells.

It should be noted that all aspects, examples, and features of disclosed embodiments mentioned in the summary above can be combined in any technically possible way. That is, two or more aspects of any of the disclosed embodiments, including those described in this summary section, may be combined to form implementations not specifically described herein. The details of one or more implementations are set forth in the accompanying drawings and the description below. Other features, objects and advantages will be apparent from the description and drawings, and from the claims.

BRIEF DESCRIPTION OF THE DRAWINGS

The present disclosure will be better understood from the following detailed description with reference to the drawings, which are not necessarily drawn to scale and in which.

DETAILED DESCRIPTION

As mentioned above, within memory-in-pixel displays, each pixel includes a light emitting diode (LED) (e.g., an ultra-LED (uLED), an embedded memory that stores data, and logic circuitry connecting the embedded memory and the LED. The use of embedded memory provides significant power savings. However, for full grayscale resolution, a relatively large number of memory cells (also referred to herein as bitcells) per pixel is required. For example, each pixel may require an array of up to twelve static random access memory (SRAM) cells or even more, thereby increasing per pixel area consumption and making target area specifications for a competitive product difficult to meet.

In view of the foregoing, disclosed herein are embodiments of a pixel with an embedded memory and compact display structure incorporating an array of such pixels (i.e., a compact memory-in-pixel display structure). The disclosed embodiments are implemented using a fully-depleted semiconductor-on-insulator processing technology platform (e.g., a fully-depleted silicon-on-insulator (FDSOI) processing technology platform). In the disclosed embodiments, each block of electronic components for a pixel can be above an insulator layer on a semiconductor substrate and can include a memory cell array, a driving circuit for a light emitting diode (LED), a logic circuit connected between the memory cell array and the driving circuit. The memory cell array can be aligned above a Pwell in the semiconductor substrate, the driving circuit can be aligned above an adjacent Nwell in the semiconductor substrate, and the logic circuit can include a combination of P-type transistors above the Nwell and N-type transistors above Pwell. Blocks of the electronic components for pixels can be arranged in an array of columns and rows and aligned above alternating elongated P and N wells with a single buried Nwell below. Each column of the blocks can be aligned above adjacent elongated P and N wells and, within each column, adjacent blocks can have mirrored layouts. Furthermore, within the array, adjacent columns of the blocks can be aligned above three wells (including two elongated wells of one type conductivity with a shared elongated well of the opposite type conductivity therebetween) and the adjacent columns can have mirrored layouts. Biasing of the alternating P and Nwells above the buried Nwell can be performed in a manner that enables pixel operation while still ensuring that diodes created at the interface between each Pwell and the adjacent Nwells to the sides and below are continuously negatively biased. Laid out and back biased as described, no breaks (e.g., no isolation regions) are required between the wells such that the blocks of the electronic components for the pixels and an array of such blocks can be relatively compact and target area specifications for competitive products can be met.

Figure 1:
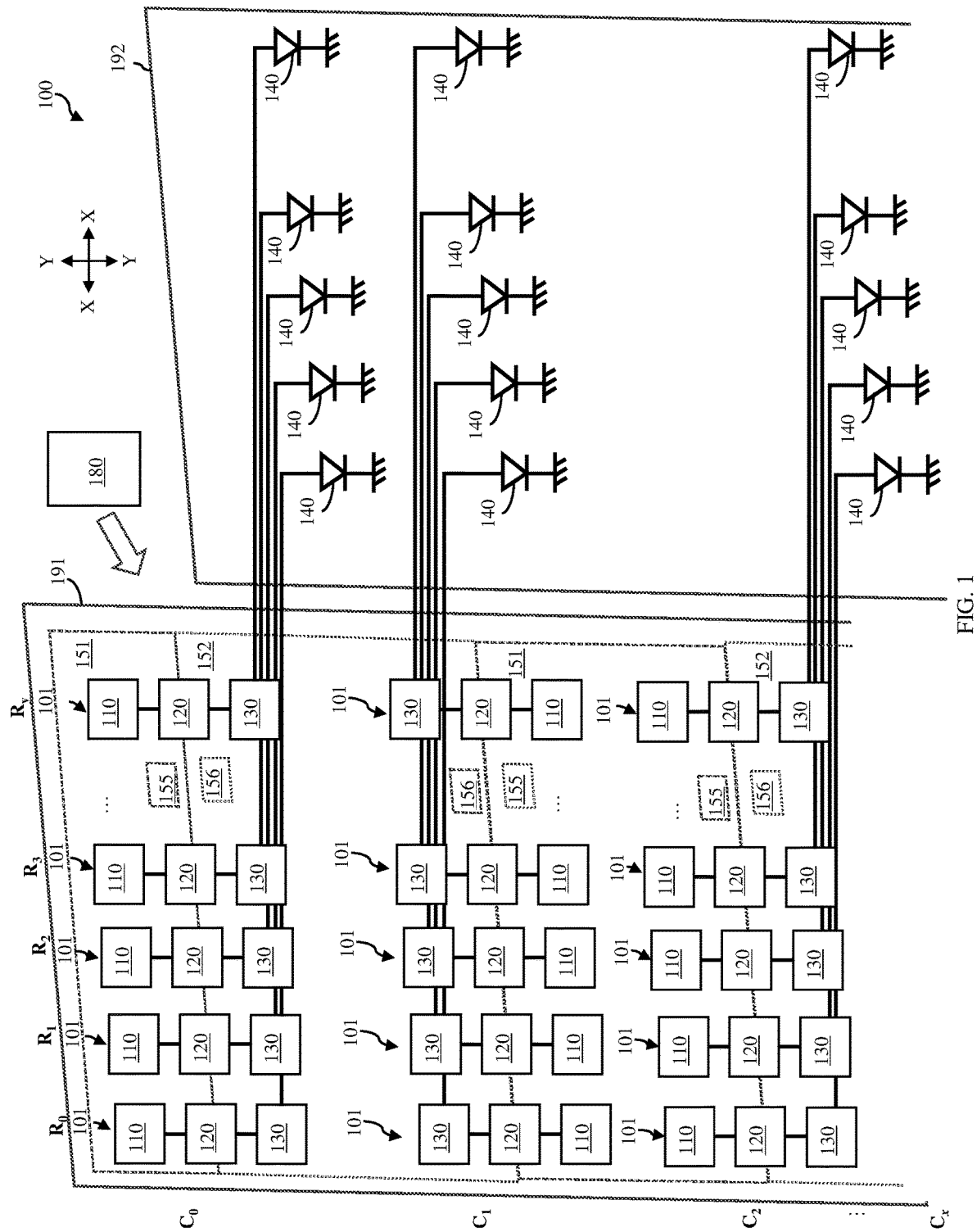
FIG. 1 is a schematic diagram illustrating embodiments of a compact memory-in-pixel display structure.

FIG. 1 is a schematic diagram illustrating embodiments of a compact memory-in-pixel display structure 100 (also referred to herein as display structure 100 or structure 100) and further illustrating embodiments of blocks 101 of electronic components for pixels therein. The display structure 100 can include control circuitry 180, at least a first section 191 including blocks 101 of electronic components for pixels (where the blocks 101 are in communication with the control circuitry 180) and a second section 192 including the optical components and, particularly, LEDs 140 for the pixels. Within the display structure 100, the two sections 191-192 can be stacked and the electrical and optical components thereon can be electrically connected, as discussed in detail below.

More specifically, the second section 192 can include LEDs 140 (e.g., uLEDs) for pixels arranged in an array across a substrate. The array can include one LED 140 for each pixel in the display structure 100. Each LED 140 can include an anode and a cathode. In response to forward biasing and, particularly, in response to a positive voltage signal received at the anode of an LED 140 of a pixel from a driving circuit 130 in a block 101 of electronic components for the pixel in the first section 191, as discussed below, the LED 140 can become conductive (i.e., forward current can pass therethrough) and a visible light signal can be emitted at the cathode.

In the disclosed embodiments (as discussed in greater detail below), a multi-bit memory-in-pixel can be employed to achieve different forward bias conditions on the LED and thereby achieve emitted light signals with different grayscale resolutions, respectively, across a range of possible grayscale resolutions from dark to light (as forward current increases). Various different structural configurations for LEDs (including ultra-LEDs (uLEDs)) on substrates are well known in the art and, thus, the details thereof have been omitted from this disclosure in order to allow the reader to focus on the salient aspects of the disclosed embodiments related to the electronic components of the display structure 100 in the first section 191.

For purposes of illustration, the disclosed display structure 100 is described herein and illustrated in the drawings as being a monochrome display. In this case, the forward bias condition on the LED of a pixel can be selectively adjusted so that the light signal emitted from the LED is at a particular gray grayscale resolution within the range from dark gray to white (e.g., less forward current results in a relative dark light signal and vice versa). The pixel is black with the LED is off. However, it should be understood that that the disclosure is not intended to be limiting and that, alternatively, the features described herein with respect to a pixel of a monochrome display can be applied to each of the red, blue, and green pixels of a color pixel of a color display. That is, for a color display, each color pixel can include a group of one red pixel with a red filter thereon, one blue pixel with a blue filter thereon, and one green pixel with a green filter thereon. Different colors and shades thereof can be achieved by a color pixel given the combination of emitted light signals from each of the red, blue and green pixels. In this case, forward bias conditions on the LED of the red pixel of the color pixel can be selectively adjusted so that the light signal emitted from that LED is at a particular red grayscale resolution (e.g., from dark red to white). Forward bias conditions on the LED of the blue pixel of the color pixel can be selectively adjusted so that the light signal emitted from that LED is at a particular blue grayscale resolution (e.g., from dark blue to white). Forward bias conditions on the LED of the green pixel of the color pixel can be selectively adjusted so that the light signal emitted from that LED is at a particular green grayscale resolution (e.g., from dark green to white). The color pixel will be black if the LEDs of the red, blue, and green pixels are all off.

Figures 2A, 2B:
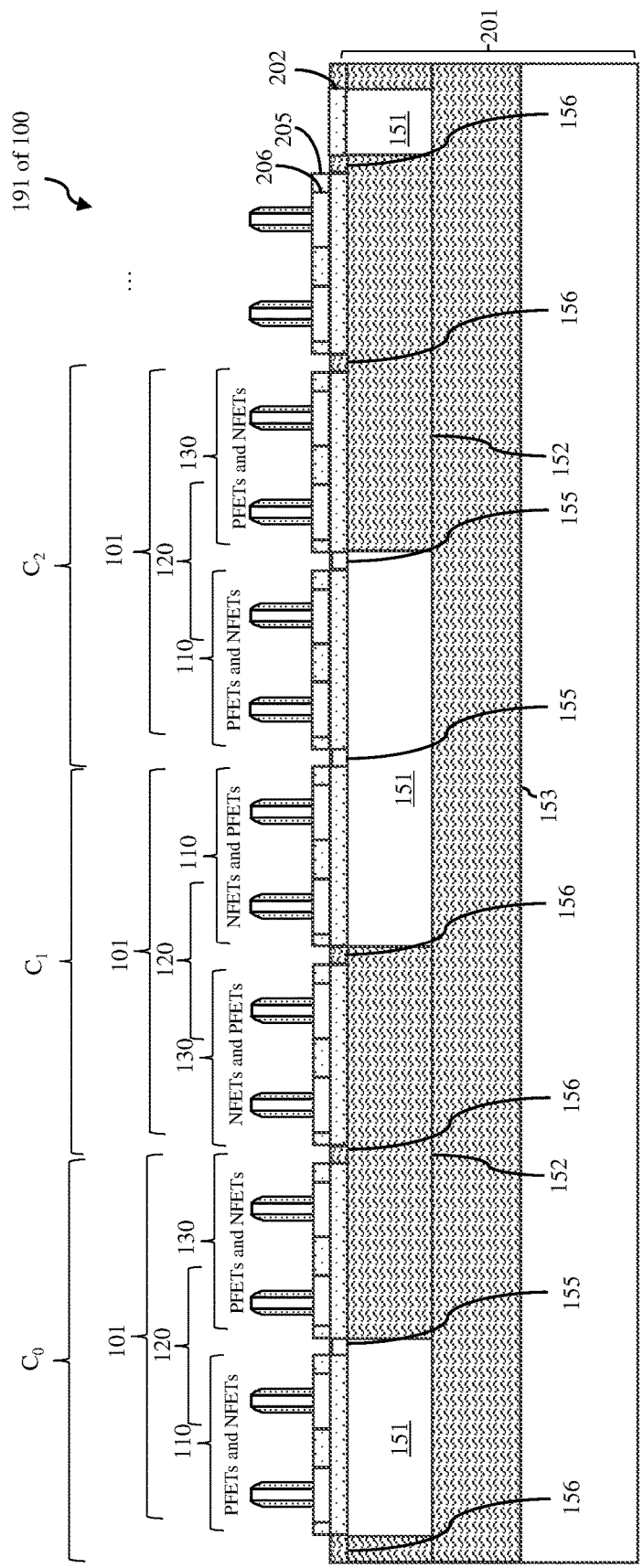
FIG. 2A is a cross-section diagram illustrating an example of a section of a compact memory-in-pixel display structure.
FIG. 2B is a table indicating threshold voltage types of transistors on the Pwells and Nwells of FIG. 2B and example back biasing conditions.

The first section 191 and, optionally, the control circuitry 180 of the display structure 100 can be implemented in a fully-depleted semiconductor-on-insulator processing technology platform (e.g., an FDSOI processing technology platform). For example, as illustrated in FIG. 2A, the structure can include a semiconductor substrate 201 and, on the semiconductor substrate 201, the first section 191. The semiconductor substrate 201 can be, for example, a monocrystalline silicon substrate or a substrate of any other suitable monocrystalline semiconductor material (e.g., silicon germanium, etc.). The semiconductor substrate 201 can further include semiconductor-on-insulator regions (e.g., SOI regions).

Each semiconductor-on-insulator region can include an insulator layer 202 on the semiconductor substrate 201. The insulator layer 202 can be, for example, a thin silicon dioxide layer or a relatively thin layer of any other suitable insulator material. Each semiconductor-on-insulator region can include a thin semiconductor layer 206 on insulator layer 202. The semiconductor layer 206 can be, for example, a monocrystalline silicon layer or a layer of any other suitable monocrystalline semiconductor material (e.g., silicon germanium, etc.).

The semiconductor substrate 201 can further include multiple well regions (wells) 151-153. For purposes of this disclosure, a well region or well refers to a region of semiconductor material doped (e.g., via a dopant implantation process or any other suitable doping process) so as to have a particular conductivity type (i.e., P-type conductivity or N-type conductivity). The well regions (wells) can include, for example, Pwells 151 (i.e., P-type well regions) and Nwells 152 (i.e., N-type well regions) in an upper portion of the semiconductor substrate 201 (e.g., at a top surface of the semiconductor substrate 201 adjacent to the insulator layer 202). The Pwells 151 and Nwells 152 can be elongated (e.g., stripes) that alternate and are positioned laterally immediately adjacent to each other across the semiconductor substrate 201 or a portion thereof. The well regions can further include an additional Nwell and, particularly, a buried Nwell 153 within the semiconductor substrate 201 below the upper portion and particularly below the Pwells 151 and Nwells 152 (without breaks) and above a lower portion of the semiconductor substrate 201 (e.g., some distance from a bottom surface of the semiconductor substrate 201). It should be noted that each Pwell 151 can be laterally surrounded by Nwell 152 that extends vertically to the buried Nwell 153, thereby electrically isolating the Pwells 151 from the lower portion of the semiconductor substrate 201 below, as long as the PN-junction diodes formed between each Pwell 151 and the adjacent Nwells 152-153 remain reverse biased. Those skilled in the art will recognize that a reverse biased diode is non-conductive due to a negative voltage on the anode and a positive voltage on the cathode, whereas a forward biased diode is conductive due to a positive voltage on the anode and a negative voltage on the cathode.

The semiconductor substrate 201 can further include bulk regions (also referred to as hybrid regions). These regions can be devoid of the insulator layer 202 and instead can include Pwell contact regions 155 (also referred to herein as Ptaps) and Nwell contact regions 156 (also referred to herein Ntaps) on the semiconductor substrate 201 immediately adjacent to the P and N wells 151, 152, respectively, and electrically isolated from the active device regions of the transistors (e.g., by isolation structures 205). The well contact regions 155, 156 can include, for example, epitaxially grown monocrystalline semiconductor layers (e.g., epitaxially grown silicon layers or epitaxially grown layers of any other suitable semiconductor material) on the top surface of the semiconductor substrate 201 immediately adjacent to the P and N wells 151, 152, respectively. Each Pwell contact region 155 can be doped (e.g., in situ or subsequently implanted) so as to have the P-type conductivity, optionally at a higher conductivity level than the Pwell 151 below. Each Nwell contact region 156 can be doped (e.g., in situ or subsequently implanted) so as to have the N-type conductivity, optionally at a higher conductivity level than the Nwell 152 below. Optionally, contact regions 155-156 can further include silicide layers thereon (not shown).

Within each semiconductor-on-insulator region, the semiconductor layer 206 can further include isolation structures 205. Isolation structures 205 can be, for example, shallow trench isolation (STI) structures including trenches, which extend vertically through the semiconductor layer 206 to or through the insulator layer 202, are filled with one or more layers of isolation material (e.g., silicon dioxide, silicon nitride, silicon oxynitride, or any other suitable isolation material), and define the boundaries of front end of the line (FEOL) device regions and provide isolation between the FEOL device regions. The FEOL device regions can include, for example, active device regions for transistors (e.g., field effect transistors (FETs)) including both P-type transistors (e.g., P-channel field effect transistors (PFETs)) and N-type transistors (e.g., N-channel field effect transistors (NFETs)).

Each FET can further include, within its active device region, a channel region (C) between source and drain regions (S/D). In PFETs, the source/drain regions can have P-type conductivity at a relatively high conductivity level (e.g., can be P+ source/drain regions) and the channel region can be either intrinsic (i.e., undoped) or can have N-type conductivity at a relatively low conductivity level (e.g., can be an N-channel region). In NFETs, the source/drain regions can have N-type conductivity at a relatively high conductivity level (e.g., can be N+ source/drain regions) and the channel region can be either intrinsic (i.e., undoped) or can have P-type conductivity at a relatively low conductivity level (e.g., can be a P— channel region).

Each FET can further include a primary gate (also referred to herein as a front gate) adjacent to (e.g., above, and immediately adjacent to) the active device region at the channel region. Those skilled in the art will recognize that, in a field effect transistor (FET), a gate (also referred to as a gate structure) can include a gate dielectric layer (including one or more layers of gate dielectric material) immediately adjacent to the channel region and a gate conductor layer (including one or more layers of gate conductor material) on the gate dielectric layer. In each FET, the primary gate can include at least a relatively thin gate dielectric layer immediately adjacent to the top surface of semiconductor layer 206 at the channel region and a gate conductor layer on the gate dielectric layer. The primary gate could be any of gate-first polysilicon gate structures, gate-first high-K metal gate (HKMG) structures, gate-last HKMG structures (also referred to as a replacement metal gate (RMG) structure), or any other suitable type of gate structures. Optionally, the primary gates of the PFETs can include gate materials different from the primary gates of the NFETs and, thus, can have different work functions. Gate sidewall spacers may be positioned laterally adjacent to sidewalls of the primary gates (e.g., to electrically isolate the gate structure from adjacent S/D regions). Such gate structures are well known in the art and, thus, the details thereof have been omitted from the specification in order to allow the reader to focus on the salient aspects of the disclosed embodiments.

Each FET can further include a secondary gate (also referred to herein as a back gate) adjacent to (e.g., below, and immediately adjacent to) the active device region opposite the primary gate. The secondary gate can include adjacent portions of the insulator layer 202 and the well region 151 or 152 below.

Those skilled in the art will recognize that one advantage of fully depleted semiconductor-on-insulator (e.g., FDSOI) technology processing platforms is that NFETs and PFETs can be formed on an insulator layer above either an Nwell or a Pwell in order to achieve different types of NFETs or PFETs with different threshold voltages (VTs). For example, for a super low threshold voltage (SLVT) or low threshold voltage (LVT) FET, an NFET can be formed above an Nwell 152 and a PFET can be formed above a Pwell 151. For a regular threshold voltage (RVT) or high threshold voltage (HVT) FET, an NFET can be formed above a Pwell 151 and a PFET can be formed above an Nwell 152. Typically, a circuit block will include all SLVT (or LVT) FETs with NFETs above Nwells and PFETs above Pwells or all RVT (or HVT) FETs with NFETs above Pwells and PFETs above Nwells. Those skilled in the art will recognize that whether the FETs are SLVT or LVT FETs or whether they are RVT or HVT FETs will depend upon the design (e.g., device size, etc.) and process specifications (e.g., dopant concentrations, etc.).

Another advantage of fully depleted semiconductor-on-insulator (e.g., FDSOI) technology processing platforms is that back gate biasing (referred to as back-biasing) can be employed to fine tune FET VTs. Forward back-biasing (FBB) refers to applying a gate bias voltage to the back gate (particularly, to the well region thereof) to reduce the VT of the FET, thereby increasing the switching speed. Generally, for a PFET, FBB is achieved by applying 0 volts (i.e., grounding) or a negative gate bias voltage to the well region; whereas, for an NFET, FBB is achieved by applying a positive gate bias to the well region. Reverse back-biasing (RBB) refers specifically to applying a gate bias voltage to the back gate (particularly, to the well region thereof) to increase the VT of the FET, thereby decreasing the switching speed and reducing leakage current. Generally, for a PFET, RBB is achieved by applying a positive gate bias voltage to the well region; whereas, for an NFET, RBB is achieved by applying a negative gate bias voltage to the well region. FIG. 2B is a table illustrating possible back biasing conditions that can be employed without forward biasing the PN-junction diodes between the Pwells and adjacent Nwells 152-153.

The first section 191 can further include middle of the line (MOL) and back end of the line (BEOL) layers stacked above the FEOL devices. The MOL and BEOL layers can include one or more layers of interlayer dielectric (ILD) material and, within the ILD material, MOL contacts and other interconnects (BEOL wires and/or vias) to provide electrical connections between FEOL devices and/or to optical components in the second section 192. Such MOL and BEOL layers including MOL contacts and BEOL interconnects are well known in the art. Thus, these MOL and BEOL features have been omitted from the figures and the details thereof have further been omitted from the specification in order to avoid clutter in the drawings and allow the reader to focus on the salient aspects of the disclosed embodiments.

In the first section 191, blocks 101 with electronic components for pixels, respectively, can be arranged in an array of columns ($C_0$-$C_x$) and rows ($R_0$-$R_y$). For purposes of illustration, columns ($C_0$-$C_x$) are shown as being oriented in the X direction (i.e., left-to-right across the page), while rows ($R_0$-$R_y$) are shown as being oriented in the Y direction (i.e., top-to-bottom across the page). In any case, each column will have y blocks and each row will have x blocks. Each block 101 can include an array 110 of memory cells, a logic circuit 120, and a driving circuit 130.

Figure 3A:
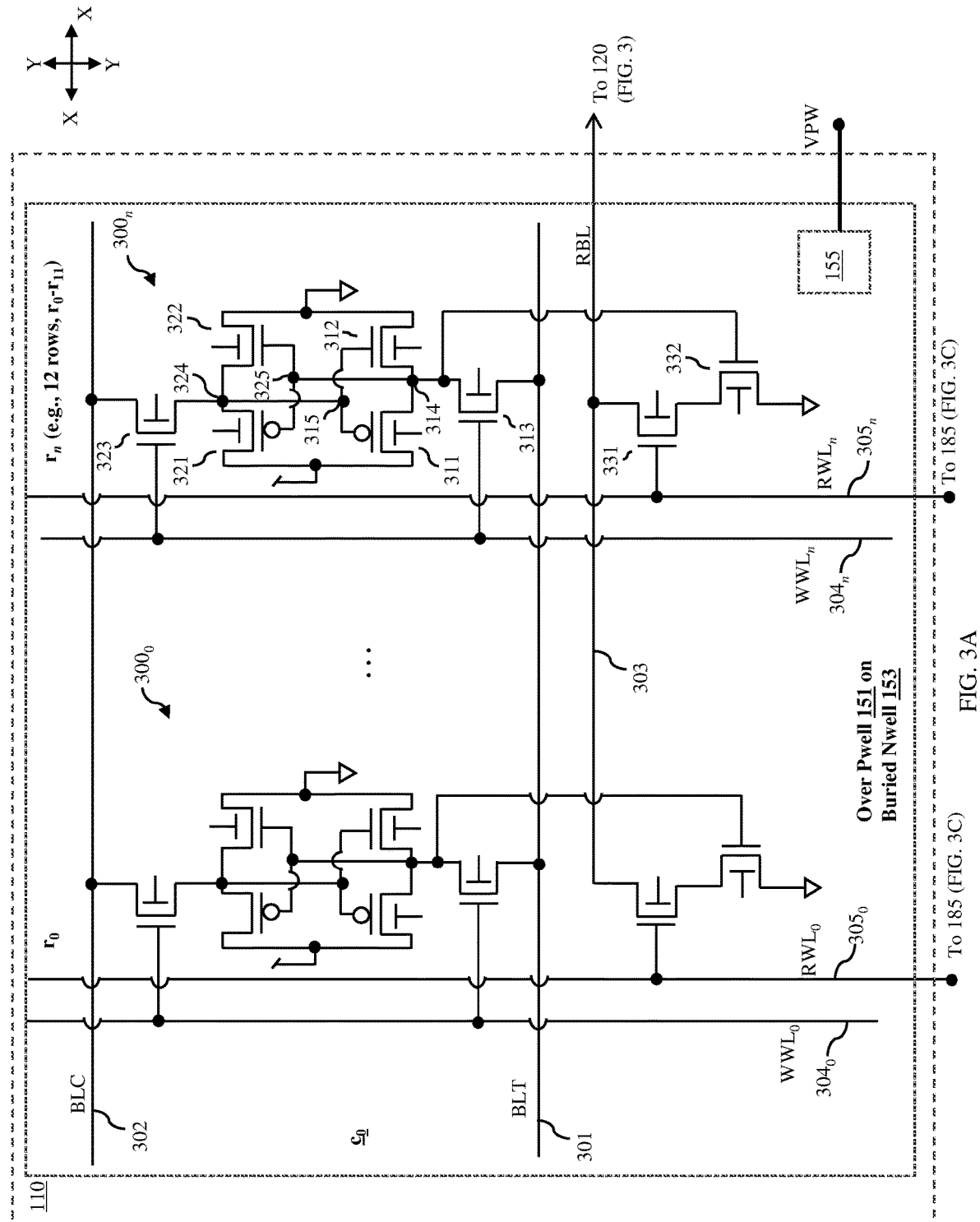
FIGS. 3A-3C are schematic diagrams illustrating an example of a block of electronic components for a pixel that can be incorporated into the display structure of FIG. 1.
Figure 3B:
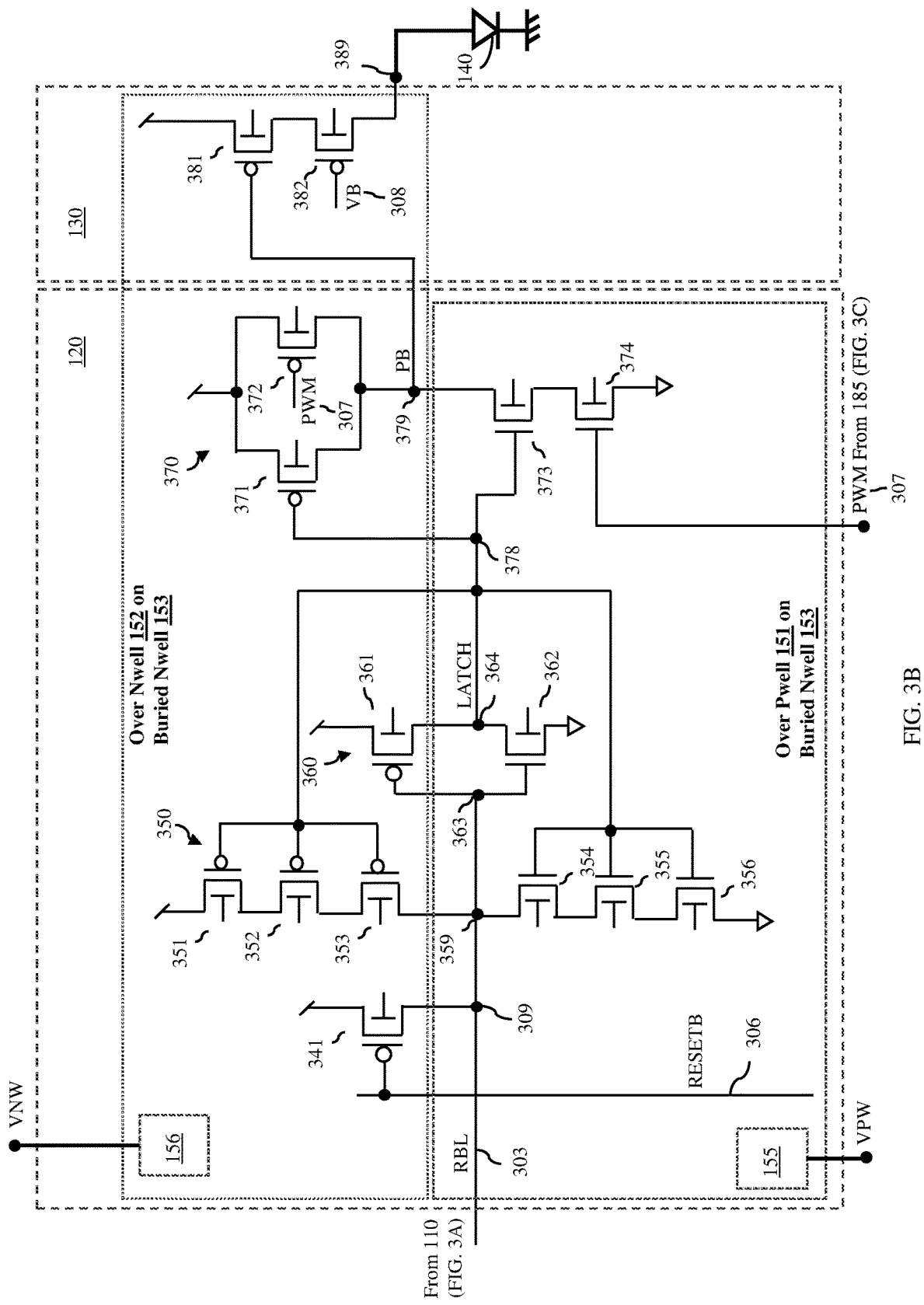
Figure 3C:
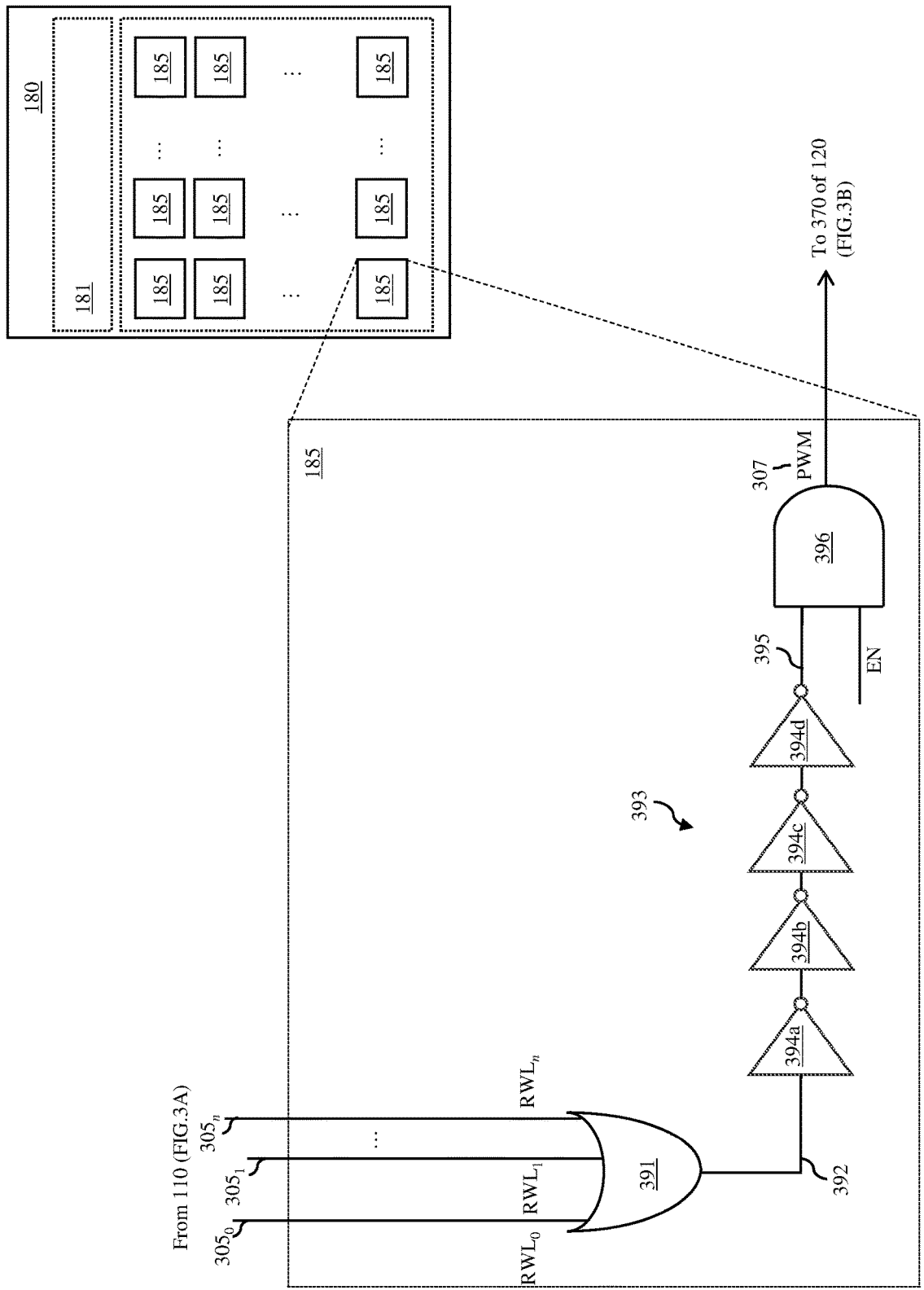
Figure 4A:
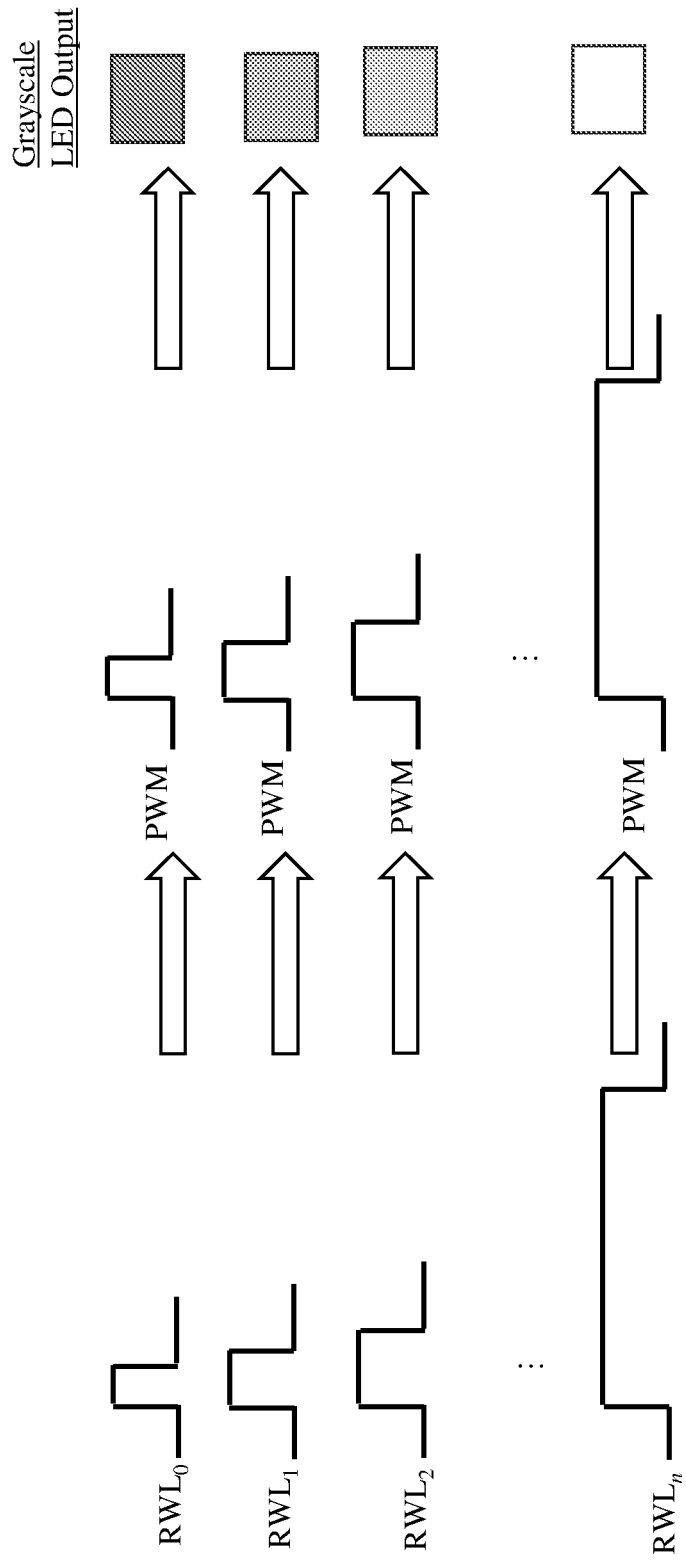
FIGS. 4A-4C are examples of timing diagrams associated with operation of the disclosed display structure.
Figure 4B:
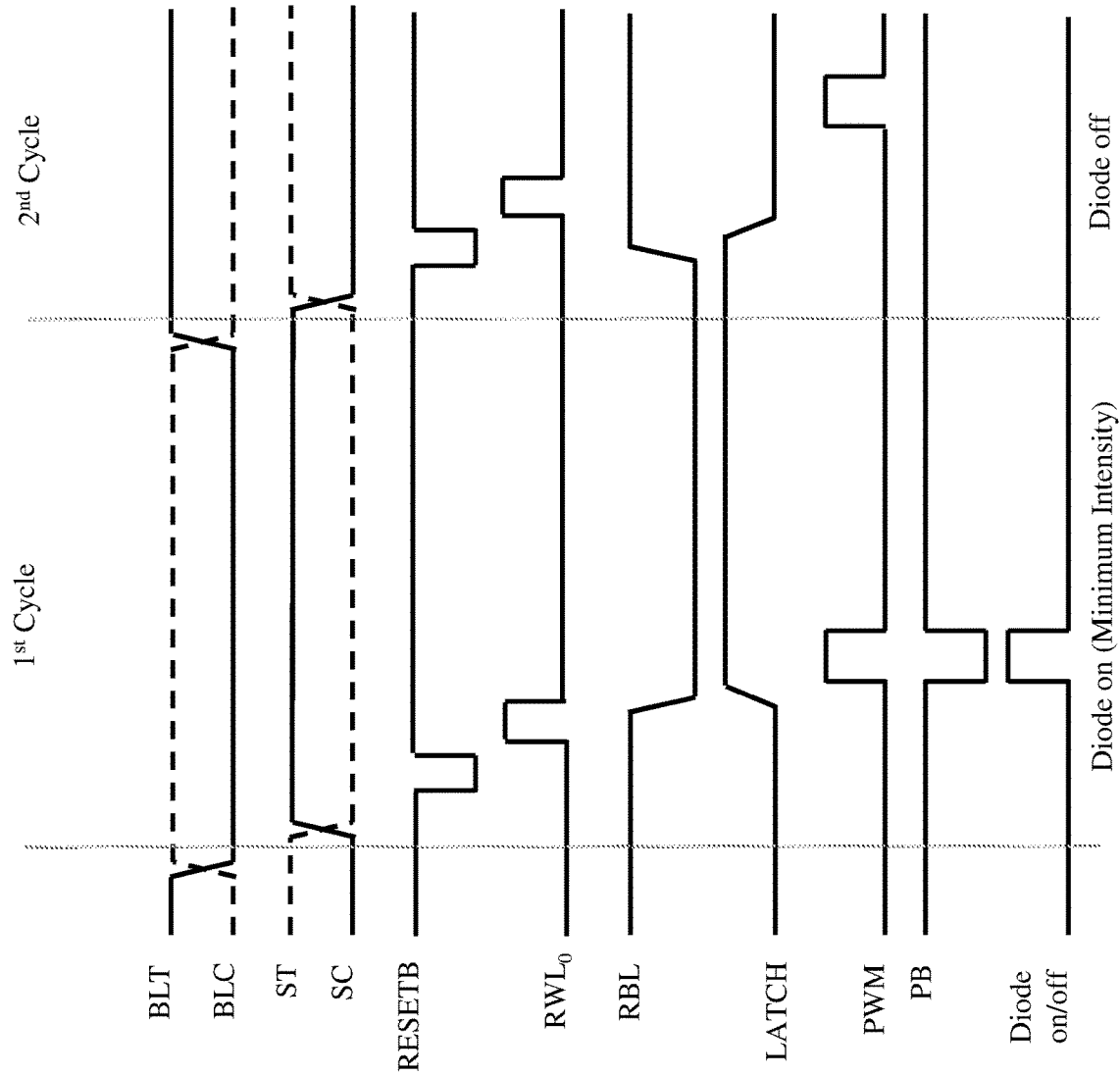
Figure 4C:
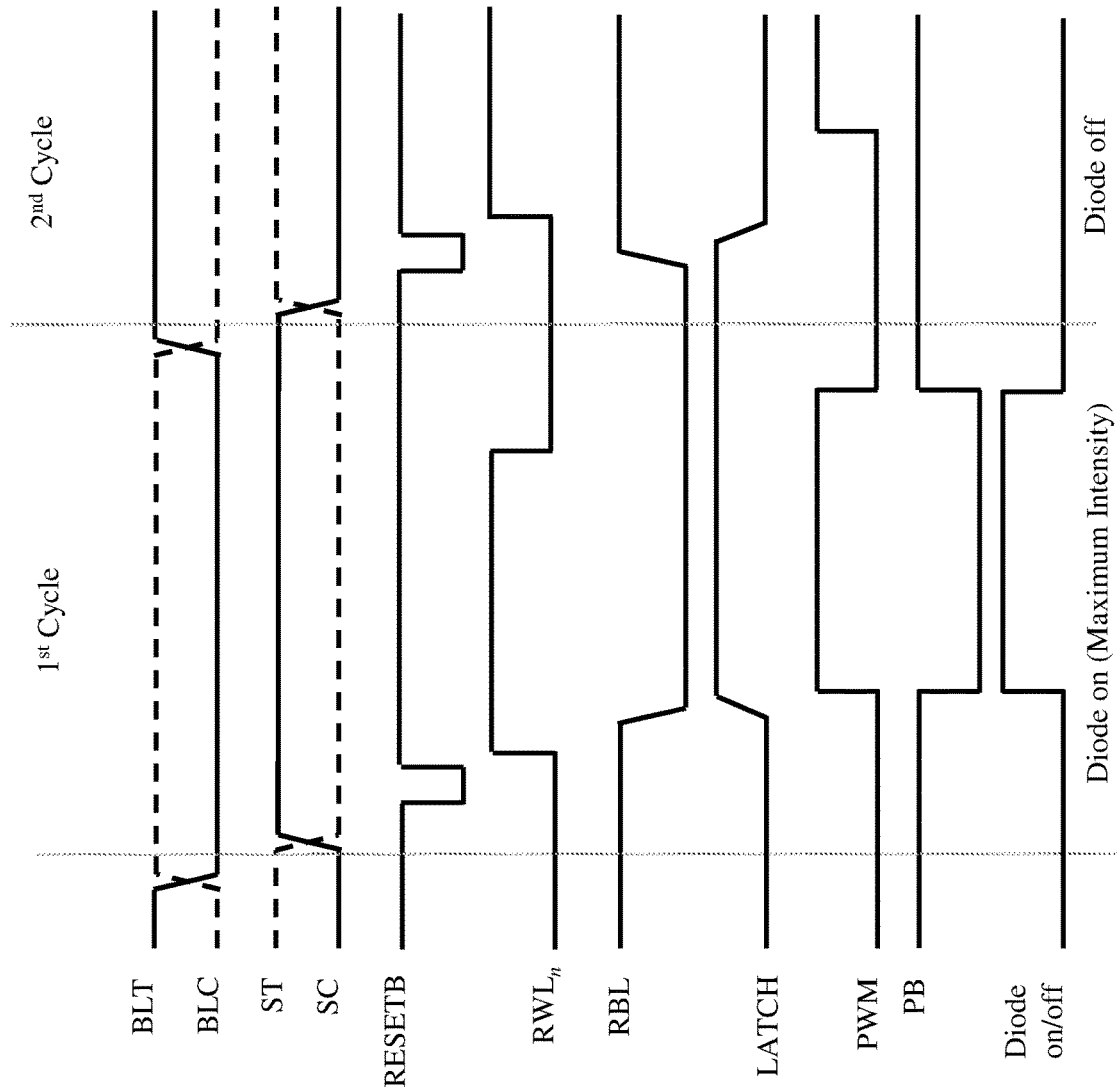

FIGS. 3A-3C are circuit diagrams illustrating components of the first section 191 as well as control circuitry (e.g., pixel-specific PWM generation logic 185) connected thereto. FIGS. 4A-4C are timing diagrams associated with operation of the components shown in FIGS. 3A-3C as well as the LEDs 140 of second section 192.

As illustrated in FIG. 3A, within each block 101, an array 110 of memory cells $300_0$-$300_n$ can be on the insulator layer 202 specifically over a Pwell 151 within the semiconductor substrate 201. The array 110 of memory cells can include a single column (co) of the memory cells $300_0$-$300_n$ and multiple rows ($r_0$-$r_n$) each with a single memory cell (i.e., $r_0$ includes memory cell $300_0$ and so on). For purposes of illustrations, the single column (co) of the memory cells $300_0$-$300_n$ is shown as being oriented in the X direction (i.e., left-to-right across the page). The array 110 can further include a first write bitline 301 (e.g., a true bitline (BLT)) and a second write bitline 302 (e.g., a complementary bitline (BLC)) electrically connected to all the memory cells $300_0$-$300_n$ in the column and further electrically connected to control circuitry 180 for receiving bitline signals including a bitline true signal (BLT) and a bitline complement signal (BLC), respectively, during a write operation. The array 110 can further include a read bitline 303 electrically connected to all of the memory cells $300_0$-$300_n$ in the column for outputting a read bitline signal (RBL) from a selected one of the memory cells $300_0$-$300_n$ during a read operation. The array 110 can also include pairs of wordlines for the rows, respectively. Specifically, the array 110 can include multiple write wordlines and multiple read wordlines including, for each row, a corresponding write wordline $304_0$-$304_n$ (connected to control circuitry 180 to receive a corresponding write wordline signal ($WWL_0$-$WWL_n$)) and a read wordline $305_0$-$305_n$ (connected to control circuitry 180 to receive a read wordline select signal ($RWL_0$-$RWL_n$)). For a given row, the corresponding write and read wordlines can each be electrically connected to the one memory cell within that given row. In some embodiments, the array 110 can include a total of twelve memory cells (i.e., twelve single memory cell rows in the one column) for full grayscale resolution. As discussed in greater detail below with regard to the read operations and illustrated in the timing diagram of FIG. 4A, $RWL_0$-$RWL_n$ can be received from the control circuitry 180 and can have progressively increasing pulse widths. That is, the RWL on the read wordlines for the rows in an array of memory cells for a pixel will have different pulse widths and, more particularly, the pulse width of $RWL_0$-$RWL_n$ will increase progressively from row to row between row $r_0$ and row $r_n$. Each memory cell $300_0$-$300_n$ can store either a data value of "1" or "0." It should be noted that control circuitry 180 can be on the same substrate as the first section 191 in a different location.

Each memory cell $300_0$-$300_n$ can be, for example, an eight-transistor static random access memory (8T-SRAM) cell. The 8T-SRAM cell can include a first inverter, which includes a first pull-up transistor 311 (a PFET) and a first pull-down transistor 312 (an NFET) connected in series between a positive supply voltage (VDD) rail and ground. The first inverter can further include a first storage node 314 (ST), which is at the junction between the first pull-up transistor 311 and the first pull-down transistor 312 and, particularly, which is at the electrical connection between the first pull-up and pull-down transistors 311-312, and a first shared gate node 315 electrically connected to the gates of the first pull-up and pull-down transistors 311-312. The 8T-SRAM cell can further include a second inverter, which includes a second pull-up transistor 321 (a PFET) and a second pull-down transistor 322 (an NFET) connected in series between the VDD rail and ground. The second inverter can further include a second storage node 324 (SC), which is between the second pull-up transistor 321 and the second pull-down transistor 322 and, particularly, which is at the electrical connection between the second pull-up and pull-down transistors 321-322, and a second shared gate node 325 electrically connected to the gates of the second pull-up and pull-down transistors 321-322. The first and second inverters can further be cross-coupled. That is, the first storage node 314 can be electrically connected to the second shared gate node 325 and the second storage node 324 can be electrically connected to the first shared gate node 315.

Each 8T-SRAM cell can further include a pair of pass-gate transistors (NFETs) and, particularly, a first pass-gate transistor 313 and a second pass-gate transistor 323. The first pass-gate transistor 313 can be connected between the first write bitline 301 (BLT) and the first storage node 314 (ST) and can further have a gate connected to the write wordline for a corresponding row. The second pass-gate transistor 323 can be connected between the second write bitline 302 (BLC) and the second storage node 324 (SC) and can further have a gate connected to the write wordline 304.

Each 8T-SRAM cell can further include two additional pull-down transistors 331-332 (NFETs), which are electrically connected in series between the read bitline 303 and ground. The gates of the two additional pull-down transistors 331-332 are connected to the read wordline for a corresponding row and to the first storage node 314, respectively.

As mentioned above, the array 110 is specifically on the insulator layer 202 above a Pwell 151. Thus, in each 8T-SRAM cell, the first and second pull-up transistors 311 and 321 are LVT (or SLVT) PFETs. Furthermore, the first and second pull-down transistors 312 and 322, the first and second pass-gate transistors 313 and 323, and the two additional pull-down transistors 331-332 are RVT (or HVT) NFETs.

It should be understood that the array 110 of memory cells $300_0$-$300_n$ (and particularly the various bitlines and wordlines) will be electrically connected to control circuitry 180 including, but not limited to, a column address decoder and a row address decoder in communication with a controller to facilitate write operations to store data on the first storage nodes 314 (STs) of the memory cells and further to facilitate read operations to read out the stored data and, thereby, cause the LED 140 to produce a light signal with a particular grayscale resolution. Generally, control circuitry for SRAM structures is well known in the art. Thus, except as otherwise described below (e.g., with respect to $RWL_0$-$RWL_n$ having progressively increasing pulse widths and pixel-specific PWM generation logic 185) the details of the control circuitry 180 have been omitted from this specification and figures in order to allow the reader to focus on the salient aspects of the disclosed embodiments and to avoid cluttering the drawings. In any case, as with a conventional 6T-SRAM, each 8T-SRAM cell can operate in three different modes: standby, write and read. In the standby mode, the cell is idle. In the write mode, a data value can be written to (i.e., stored on) the first storage node 314 (ST). For example, if a data value of "1" (i.e., a high data value) is to be written to the first storage node 314 (ST), the control circuitry 180 can cause first write bitline 301 (BLT) to be pre-charged and the second write bitline 302 (BLC) to be discharged to ground. Then, the control circuitry 180 can cause WWL on the write wordline to be pulsed to a high voltage level to turn on the first and second pass-gate transistors 313 and 323 and, thereby store the data value "1" on the first storage node 314 (ST). Contrarily, if a data value of "0" (i.e., a low data value) is to be written to the first storage node 314 (ST), the control circuitry 180 can cause the first write bitline 301 (BLT) to be discharged to ground and the second write bitline 302 (BLC) to be pre-charged. Then, the control circuitry 180 can cause WWL on the write wordline to be pulsed to a high voltage level to turn on the first and second pass-gate transistors 313, 323 and thereby store the data value "0" on the first storage node 314 (ST).

As illustrated in FIG. 3B, each block 101 can also include driving circuit 130, which is electrically connected to the anode of an LED 140, and a logic circuit 120, which is electrically connected between the array 110 and the driving circuit 130.

The logic circuit 120 can have an input node 309 electrically connected to the read bitline 303 of array 110 and can further include a combination of both P-type transistors (PFETs) and N-type transistors (NFETs). Specifically, the logic circuit 120 can further include a P-type transistor (PFET) 341 and, particularly, a reset pull-up transistor, which is electrically connected between the VDD rail and the input node 309 and which has a gate electrically connected to a reset line 306. The reset line 306 can be electrically connected to receive a reset control signal (RESETB) (e.g., from control circuitry 180). Those skilled in the art will recognize that if the reset line 306 is discharged to ground (i.e., if RESETB is low) the reset pull-up transistor 341 will turn on and pull-up the voltage on the read bitline 303 to VDD, whereas if the reset line 306 is charged (i.e., if RESETB is high) the reset pull-up transistor 341 will turn off.

The logic circuit 120 can further include a keeper circuit 350. The keeper circuit 350 can be a latch which stores a data value previously read out from one of the SRAM cells in the memory array 110 until RESETB is asserted low. The latch can include multiple P-type transistors (PFETs) (e.g., three PFETs 351-353), which are electrically connected in series between the VDD rail and an intermediate node 359 that is electrically connected to the input node 309). The latch can also include multiple N-type transistors (NFETs) (e.g., three NFETs 354-356) that are electrically connected in series between the intermediate node 359 and ground. Finally, the latch can include an inverter 360. The inverter 360 can include a P-type transistor (PFET) 361 and an N-type transistor (NFET) 362, which are electrically connected in series between the VDD rail and ground. The inverter 360 can further include an inverter input terminal 363 and, particularly, a shared gate node that is electrically connected to the intermediate node 359 and to the gates of PFET 361 and NFET 362. The inverter 360 can further include an inverter output terminal 364 at the junction (i.e., at the electrical connection) between drain regions of the PFET 361 and the NFET 362. The inverter output terminal 364 can output a latch signal (LATCH) and can further be electrically connected in a feedback loop to the keeper circuit 350. Specifically, the inverter output terminal 364 can be electrically connected to a shared gate node for the gates of the PFETs 351-353 and also to a shared gate node for the gates of the NFETs 354-356. Thus, the states of the PFETs 351-353 and NFETs 354-356 are controlled by LATCH.

The logic circuit 120 can further include a NAND gate 370 (which effectively serves as a pulse width controller for the driving circuit 130 as discussed below). The NAND gate 370 can include a pair of P-type transistors (PFETs) 371-372, which are connected in parallel between the VDD rail and a NAND gate output node 379. The NAND gate 370 can also include a pair of N-type transistors (NFETs) 373-374, which are electrically connected in series between the NAND gate output node 379 and ground. The NAND gate 370 can further have a first NAND gate input node 378, which is electrically connected to the inverter output terminal 364 to receive LATCH and which is further electrically connected to the gates of PFET 371 and NFET 373. The NAND gate 370 can further have a second NAND gate input node, which is electrically connected to receive a pulse width modulation signal (PWM) 307 (from pixel-specific PWM generation logic 185, as discussed in greater detail below) and which is further electrically connected to the gates of PFET 372 and NFET 374. Such a NAND gate 370 can operate according to a conventional NAND gate truth table. That is, the output signal (PB) at the NAND gate output node 379 will only be pulled to a low voltage level (i.e., a logic "0") when both the voltage level on the inverter output terminal 364 of the inverter 360 is high and PWM is high. Otherwise, PB at the NAND gate output node 379 will be at a high voltage level (i.e., a logic "1").

Within this logic circuit 120, all PFETs 341, 351-353, 361, and 371-372 can be on the insulator layer 202 and aligned over an Nwell 152, which is positioned laterally immediately adjacent to the Pwell 151 on which the array 110 sits. Furthermore, within the logic circuit 120, NFETs 354-356, 362, and 373-374 can be on the insulator layer 202 and aligned above the same Pwell 151 on which the array 110 sits. Thus, within the logic circuit 120, the PFETs can all be RVT (or HVT) PFETs and the NFETs can all be RVT (or HVT) NFETs.

The driving circuit 130 can include two additional P-type transistors (PFETs) 381-382 electrically connected in series between the VDD rail and a driving circuit output node 389. The driving circuit output node 389 can be electrically connected (e.g., through a combination of interconnects including, but not limited to, MOL contact(s), BEOL via(s) and/or wire(s), and through substrate via(s) (TSV(s))) to the anode of a corresponding LED 140 in the second section 192. In this driving circuit 130, the gates of the PFETs 381-382 can be connected to receive PB from the NAND gate output node 379 and further connected to receive another gate bias voltage (VB) 308 (i.e., a driving circuit enable signal from, for example, control circuitry 180). In operation, when both PB and VB are low, the LED 140 will become forward biased, and a visible light signal will be emitted at the cathode. However, the length of time that PB is low (i.e., the pulse width of PB between falling and rising edges) will be a function of the pulse width (between rising edges and falling edges) of PWM, as generated by pixel-specific PWM generation logic 185 and the particular gray-scale resolution of the emitted light signal from the LED 140 will vary depending upon that pulse width. For example, if the pulse width of PWM and thereby the pulse width of PB is relatively short during forward biasing of the LED 140, the particular grayscale resolution of the emitted light signal from the LED 140 will be relatively low (e.g., dark gray). If PWM and thereby PB have minimum pulse widths, the particular grayscale resolution of the emitted light signal from the LED 140 can be at a minimum level (e.g., at the darkest gray level). If the pulse width of PWM and thereby the pulse width of PB is relatively long during forward biasing of the LED 140, the particular grayscale resolution of the emitted light signal from LED 140 will be relatively high (e.g., light gray). If PWM and thereby PB have the maximum pulse widths, the particular grayscale resolution of the emitted light signal from the LED 140 can be at a maximum level (e.g., white).

Within this driving circuit 130, all PFETs 381-382 can be on the insulator layer 202 and aligned over the same Nwell 152 as the PFETs of the logic circuit 120. Thus, within the driving circuit 130, the PFETs can all be RVT (or HVT) PFETs.

As mentioned above, the memory cells $300_0$-$300_n$ (i.e., SRAM cells) can store data values of "1" or "0." Additionally, $RWL_0$-$RWL_n$, which are electrically connected to the memory cells $300_0$-$300_n$, respectively, can be received from the control circuitry 180 and can have progressively increasing pulse widths. For each pixel, $RWL_0$-$RWL_n$ can also be electrically connected to corresponding pixel-specific PWM generation logic 185 (e.g., as illustrated in FIG. 3C). The pixel-specific PWM generation logic 185 can be configured to monitor $RWL_0$-$RWL_n$ and adjust PWM accordingly. For example, the pixel-specific PWM generation logic 185 can include an OR gate 391 electrically connected to receive, as inputs, each of $RWL_0$-$RWL_n$. The OR gate 391 can be configured to output an intermediate output signal 392 according to a conventional OR gate truth table. That is, the intermediate output signal 392 can be at a logic "0" when $RWL_0$-$RWL_n$ are all low (i.e., at logic "0") and can be at a logic "1" when any one of $RWL_0$-$RWL_n$ are high (i.e., at a logic "1"). The pixel-specific PWM generation logic 185 can further include a delay component 393 (including, for example, four series-connected inverters 394a-394d), which is electrically connected to receive the intermediate output signal 392 from the OR gate 391 and to output a delayed output signal 395. The pixel-specific PWM generation logic 185 can further include an AND gate 396, which is electrically connected to receive, as inputs, the delayed output signal 395 from the delay component 393 and an enable signal (EN) (e.g., from the control logic). The AND gate 396 can be configured to output PWM to the NAND gate 370 of the logic circuit 120 according to a conventional AND gate truth table. That is, PWM will be high (i.e., at a logic "1") when both the delayed output signal 395 from the delay component 393 and the EN signal are both high (i.e., at logic "1"). Otherwise, PWM will be low.

During a read operation of a selected one of the memory cell $300_0$-$300_n$, EN will be switch high and one of $RWL_0$-$RWL_n$ will be pulsed in order to read out the stored data from a selected one of the memory cells $300_0$-$300_n$. As long as one of $RWL_0$-$RWL_n$ are high, the intermediate output signal 392 will be high and the delayed output signal 395 from the delay component 393 will got high. When the delayed output signal 395 and EN are high, PWM output from the AND gate 396 will be high. Thus, as illustrated in FIG. 4A, if memory cell $300_0$ is selected for a read operation, $RWL_0$ with the shortest pulse width will be pulsed and PWM will stay high for a relatively short period of time, whereas if memory cell $300_n$ is selected for a read operation, $RWL_n$ with the shortest pulse width will be pulsed and PWM will stay high for a relatively long period of time.

More specifically, FIG. 4B is a timing diagram illustrating various signals within a memory-in-pixel during a first read cycle of memory cell $300_0$ when it stores a data value of "0" and also during a second read cycle of memory cell $300_0$ when it stores a data value of "1." As mentioned above, the pulse width of $RWL_0$ is relatively short and, thus, PWM will be relatively short. At the beginning of the first read cycle of memory cell $300_0$ when it stores a data value of "0" (i.e., when ST is low), RESETB is pulsed low to turn on PFET 341 and, thereby pull up/reset the voltage level on the read bitline 303. $RWL_0$ is pulsed high. Since BLT is low, BLC is high, ST is low and SC is high, RBL will be pulled low and cause LATCH to be pulled high. Then, when PWM is pulsed high (for a short period of time) and LATCH is high, PB output from the NAND gate 370 will be low. As a result, PFET 381 of the driving circuit 130 will turn on and the LED 140 will turn on for the time period set by the relatively short pulse width of PWM (e.g., for a dark gray light signal). At the beginning of the second read cycle of memory cell $300_0$ when it stores a data value of "1" (i.e., when ST is high), RESETB is pulsed low to turn on PFET 341 and, thereby pull up/reset the voltage level on the read bitline 303. $RWL_0$ is pulsed high. Since BLT is high, BLC is low, ST is high and SC is low, RBL will remain high and cause LATCH to be low. If LATCH is low, PB output from the NAND gate 370 will be high (regardless of the pulse width of PWM) and the LED 140 will remain off.

FIG. 4C is a timing diagram illustrating various signals within a memory-in-pixel during a first read cycle of memory cell $300_n$ when it stores a data value of "0" and also during a second read cycle of memory cell $300_n$ when it stores a data value of "1." As mentioned above, the pulse width of $RWL_n$ is relatively long and, thus, PWM will be relatively long. At the beginning of the first read cycle of memory cell $300_n$ when it stores a data value of "0" (i.e., when ST is low), RESETB is pulsed low to turn on PFET 341 and, thereby pull up/reset the voltage level on the read bitline 303. $RWL_n$ is pulsed high. Since BLT is low, BLC is high, ST is low and SC is high, RBL will be pulled low and cause LATCH to be pulled high. Then, when PWM is pulsed high (for a long period of time) and LATCH is high, PB output from the NAND gate 370 will be low. As a result, PFET 381 of the driving circuit 130 will turn on and the LED 140 will turn on for the time period set by the relatively long pulse width of PWM (e.g., for a white light signal). At the beginning of the second read cycle of memory cell $300_n$, when it stores a data value of "1" (i.e., when ST is high), RESETB is pulsed low to turn on PFET 341 and, thereby pull up/reset the voltage level on the read bitline 303. $RWL_n$ is pulsed high. Since BLT is high, BLC is low, ST is high and SC is low, RBL will remain high and cause LATCH to be low. If LATCH is low, PB output from the NAND gate 370 will be high (regardless of the pulse width of PWM) and the LED 140 will remain off.

Figure 5:
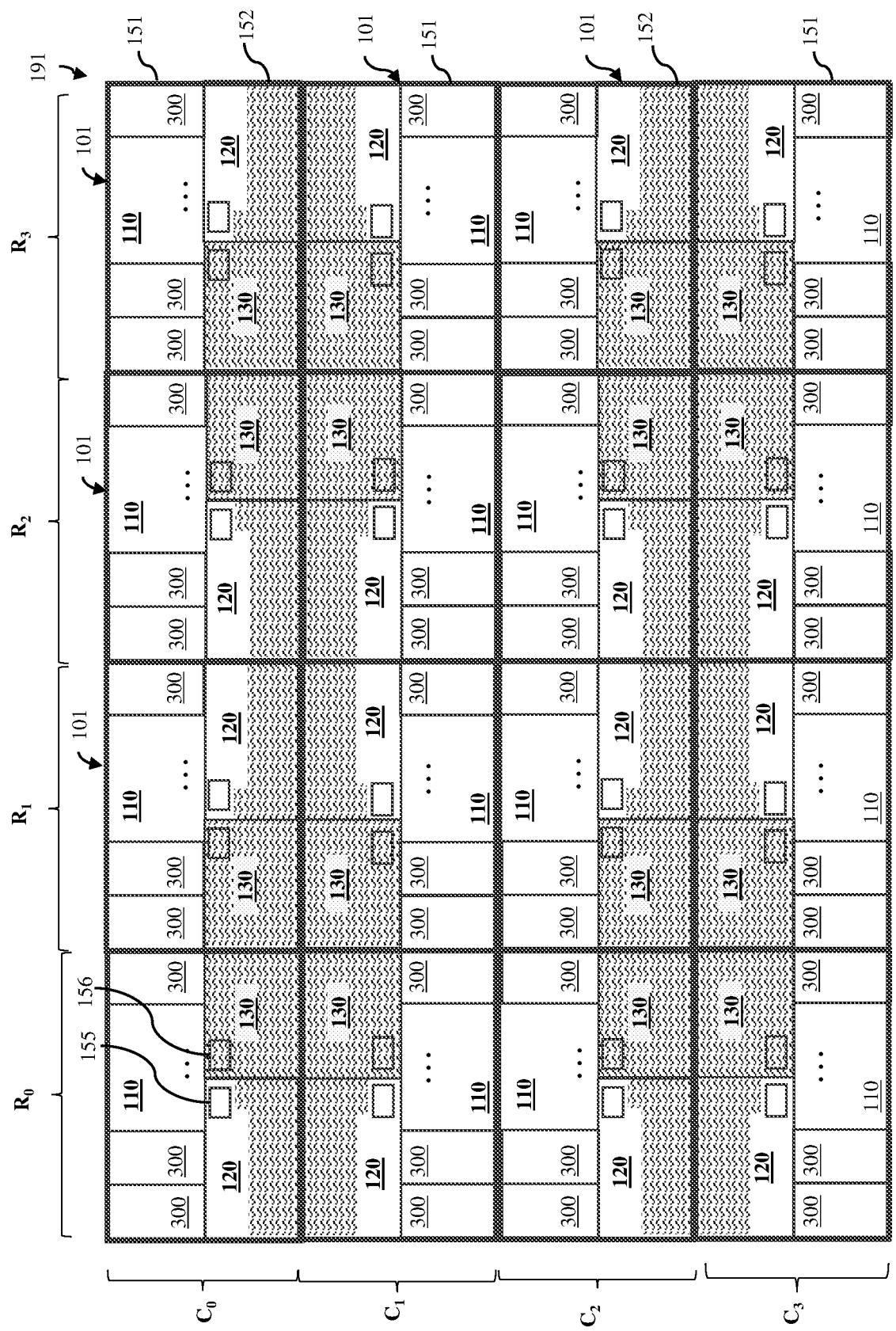
FIG. 5 is a diagram illustrating an example of a layout for the disclosed display structure.

As mentioned above, in the first section 191, blocks 101 with electronic components for pixels, respectively, can be arranged in an array of columns ($C_0$-$C_x$) and rows ($R_0$-$R_y$). FIG. 5 is a diagram illustrating an example of a layout (also referred to herein as a floorplan) that can be employed in order to achieve compact display structure. For purposes of illustration, the layout diagram of FIG. 5 shows four columns ($C_0$-$C_3$) and four rows ($R_0$-$R_3$) of blocks 101. It should be understood that FIG. 5 is not intended to be limiting and that, alternatively, such an array can include any number of one or more columns and one or more rows. In any case, as illustrated, each column can be aligned over an elongated Pwell 151 and an elongated Nwell 152, which is positioned laterally immediately adjacent to the elongated Pwell 151. Each block 101 of electronic components for a pixel can overlie the Pwell-to-Nwell interface with the entire memory array 110 and the NFETs 354-356, 362, and 373-374 of the logic circuit 120 being above the Pwell 151 and with the entire driving circuit 130 and the PFETs 341, 351-353, 361 and 371-372 of the logic circuit 120 being above the Nwell 152. For purposes of illustration, each block 101 is shown as including one Pwell contact region 155 (i.e., one Ptap) and one Nwell contact region 156 (i.e., one Ntap). It should be noted that the number of taps per well region should be sufficient to ensure that the entire well region is sufficiently biased. Thus, for example, more than one Ptap and one Ntap per block 101 may be required or only one Ptap and one Ntap per every few blocks 101 may be required. The number of taps will be determined based on design rules for the technology node at issue.

It should be noted that in order to achieve the desired compact structure and, particularly, for more effective use of chip area, the buried Nwell (not shown) can be below all of the elongated P and Nwells 151-152 without any breaks (i.e., without any isolation regions). Additionally, the adjacent elongated P and Nwells 151-152 can each have both wide and narrow portions with interlocking stepped shapes (as opposed to the adjacent P and Nwells simply being relatively wide elongated rectangular shapes). As illustrated, wide portions of the Pwell can be adjacent to narrow portions of the Nwell and vice versa to accommodate placement of the various P-type and N-type transistors of the blocks 101 thereon as described above. Furthermore, adjacent blocks 101 of electronic components within each column can have mirrored block layouts. That is, the arrays 110 of memory cells of the blocks can be arranged in a line across the elongated Pwell as illustrated. However, in the same column, first and second blocks 101 will have adjacent driving circuits 130 on a wide portion of the Nwell and second and third blocks will have adjacent logic circuits 120 over an interface between a wide portion of the Pwell and a narrow portion of the Nwell, and so on. Finally, adjacent columns of blocks 101 can have mirrored column layouts aligned over three different wells including two wells of one type conductivity and a shared well of the opposite type conductivity therebetween (e.g., over two Pwells and a shared Nwell in between or over two Nwells and a shared Pwell in between). For example, as illustrated in FIG. 5, adjacent columns $C_0$ and $C_1$ of blocks 101 have mirrored column layouts aligned over two Pwells and a shared Nwell in between; adjacent columns $C_1$ and $C_2$ of blocks 101 have mirrored column layouts aligned over two Nwells and a shared Pwell in between; and adjacent columns $C_2$ and $C_3$ of blocks 101 have mirrored column layouts aligned over two Pwells and a shared Nwell in between.

It should be understood that in the structures and method described above, a semiconductor material refers to a material whose conducting properties can be altered by doping with an impurity. Such semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped with a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region. Furthermore, when a semiconductor region or layer is described as being at a higher conductivity level than another semiconductor region or layer, it is more conductive (less resistive) than the other semiconductor region or layer; whereas, when a semiconductor region or layer is described as being at a lower conductivity level than another semiconductor region or layer, it is less conductive (more resistive) than that other semiconductor region or layer.

It should be understood that the terminology used herein is for the purpose of describing the disclosed structures and methods and is not intended to be limiting. For example, as used herein, the singular forms "a," "an" and "the" are intended to include the plural forms as well, unless the context clearly indicates otherwise. Additionally, as used herein, the terms "comprises," "comprising," "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right," "left," "vertical," "horizontal," "top," "bottom," "upper," "lower," "under," "below," "underlying," "over," "overlying," "parallel," "perpendicular," etc., are intended to describe relative locations as they are oriented and illustrated in the drawings (unless otherwise indicated) and terms such as "touching," "in direct contact," "abutting," "directly adjacent to," "immediately adjacent to," etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various disclosed embodiments have been presented for purposes of illustration but are not intended to be exhaustive or limiting. Many modifications and variations will be apparent to those of ordinary skill in the art without departing from the scope and spirit of the disclosed embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
    an array of memory cells on an insulator layer over a Pwell in a semiconductor substrate;
    a driving circuit on the insulator layer over an Nwell in the semiconductor substrate, wherein the Nwell is positioned laterally adjacent to the Pwell and wherein the driving circuit is connected to an anode of a light emitting diode; and
    a logic circuit on the insulator layer connected to the array of the memory cells and the driving circuit, wherein the logic circuit includes P-type transistors on the insulator layer over the Nwell and N-type transistors on the insulator layer over the Pwell.

2. The structure of claim 1, further comprising:
    a Pwell contact region on the Pwell;
    an Nwell contact region on the Nwell; and
    an additional Nwell in the semiconductor substrate below the Nwell and the Pwell.

3. The structure of claim 1, wherein the array of the memory cells includes:
    a single column and multiple rows, wherein each row has a single memory cell;
    a first write bitline, a second write bitline, and a read bitline connected to all the memory cells in the single column; and
    write wordlines and read wordlines including, for each row, a write wordline and a read wordline connected to the single memory cell in the row.

4. The structure of claim 3, wherein the single column includes twelve memory cells.

5. The structure of claim 3, wherein each memory cell is an eight-transistor static random access memory cell including:
    a first inverter including a first pull-up transistor and a first pull-down transistor connected in series and a first storage node at a connection between the first pull-up transistor and the first pull-down transistor;
    a second inverter including a second pull-up transistor and a second pull-down transistor connected in series and a second storage node at a connection between the second pull-up transistor and the second pull-down transistor, wherein the first inverter and second inverter are cross coupled;
    a first pass-gate transistor connected between the first write bitline and the first storage node, wherein a gate of the first pass-gate transistor is connected to the write wordline;
    a second pass-gate transistor connected between the second write bitline and the second storage node, wherein a gate of the second pass-gate transistor is connected to the write wordline; and
    two additional pull-down transistors connected in series between the read bitline and ground, wherein gates of the two additional pull-down transistors are connected to the read wordline and the first storage node, respectively.

6. The structure of claim 3,
    wherein the logic circuit includes:
    an input node connected to the read bitline;
    a reset line;
    a P-type transistor connected between a positive supply voltage rail and the input node;
    three P-type transistors connected in series between the positive supply voltage rail and the input node;
    three N-type transistors connected in series between the input node and ground;
    an inverter connected between the input node and an output node,
        wherein the P-type transistor has a gate connected to the reset line,
        wherein the three P-type transistors and the three N-type transistors have gates connected to the output node; and
    a NAND gate having inputs connected to the output node and to receive a pulse width modulation signal,
    wherein a pulse width of the pulse width modulation signal depends on a pulse width of a read wordline select signal on a read wordline connected to a memory cell during a read operation directed to the memory cell, and
    wherein pulse widths of read wordline select signals on the read wordlines increase progressively from row to row.

7. The structure of claim 6, wherein the driving circuit includes two additional P-type transistors connected in series between the positive supply voltage rail and the anode of the light emitting diode, wherein one of the two additional P-type transistors has a gate connected to an output of the NAND gate and another of the two additional P-type transistors has a gate connected to receive a gate bias voltage.

8. The structure of claim 1, wherein the Pwell and the Nwell have interlocking stepped shapes.

9. A structure comprising:
   a semiconductor substrate including a Pwell and an Nwell adjacent to the Pwell;
   an insulator layer on the semiconductor substrate over the Pwell and the Nwell; and
   blocks of electronic components for pixels, respectively, wherein each block includes:
      an array of memory cells on the insulator layer over the Pwell;
      a driving circuit on the insulator layer over the Nwell and connected to an anode of a light emitting diode; and
      a logic circuit on the insulator layer connected between the array of the memory cells and the driving circuit, wherein the logic circuit includes P-type transistors on the Nwell and N-type transistors on the Pwell.

10. The structure of claim 9, further comprising:
    Pwell contact regions on the Pwell;
    Nwell contact regions on the Nwell; and
    an additional Nwell in the semiconductor substrate below the Nwell and the Pwell,
    wherein the additional Nwell isolates the Pwell from a lower portion of the semiconductor substrate.

11. The structure of claim 9, wherein the array of memory cells in each block includes:
    a single column of the memory cells and multiple rows each with a single memory cell;
    a first write bitline, a second write bitline, and a read bitline connected to all the memory cells in the single column; and
    write wordlines and read wordlines including, for each row, a write wordline and a read wordline connected to the single memory cell in the row.

12. The structure of claim 11, wherein the single column of the memory cells includes twelve memory cells.

13. The structure of claim 11, wherein each memory cell is an eight-transistor static random access memory cell including:
    a first inverter including a first pull-up transistor and a first pull-down transistor connected in series and a first storage node at a connection between the first pull-up transistor and the first pull-down transistor;
    a second inverter including a second pull-up transistor and a second pull-down transistor connected in series and a second storage node at a connection between the second pull-up transistor and the second pull-down transistor, wherein the first inverter and second inverter are cross coupled;
    a first pass-gate transistor connected between the first write bitline and the first storage node, wherein a gate of the first pass-gate transistor is connected to the write wordline;
    a second pass-gate transistor connected between the second write bitline and the second storage node, wherein a gate of the second pass-gate transistor is connected to the write wordline; and
    two additional pull-down transistors connected in series between the read bitline and ground, wherein gates of the two additional pull-down transistors are connected to the read wordline and the first storage node, respectively.

14. The structure of claim 11, wherein the logic circuit includes:
    an input node connected to the read bitline;
    a reset line;
    a P-type transistor connected between a positive supply voltage rail and the input node;
    three P-type transistors connected in series between the positive supply voltage rail and the input node;
    three N-type transistors connected in series between the input node and ground;
    an inverter connected between the input node and an output node,
       wherein the P-type transistor has a gate connected to the reset line, and
       wherein the three P-type transistors and the three N-type transistors have gates connected to the output node; and
    a NAND gate having inputs connected to the output node and to receive a pulse width modulation signal,
       wherein a pulse width of the pulse width modulation signal depends on a pulse width of a read wordline select signal on a read wordline connected to a memory cell during a read operation directed to the memory cell, and
       wherein pulse widths of read wordline select signals on the read wordlines increase progressively from row to row.

15. The structure of claim 14, wherein the driving circuit includes two additional P-type transistors connected in series between the positive supply voltage rail and the anode of the light emitting diode, wherein one of the two additional P-type transistors has a gate connected to an output of the NAND gate and another of the two additional P-type transistors has a gate connected to receive a gate bias voltage.

16. The structure of claim 9, wherein the Pwell and the Nwell have interlocking stepped shapes.

17. A structure comprising:
    a semiconductor substrate including alternating Pwells and Nwells;
    an insulator layer on the semiconductor substrate over the alternating Pwells and Nwells; and
    an array of blocks of electronic components for an array of pixels, respectively,
    wherein the array of blocks of electronic components includes at least two columns of the blocks of electronic components,
    wherein the at least two columns of blocks of electronic components having mirrored column layouts aligned over two wells of one type conductivity and a shared well of an opposite type conductivity therebetween, and
    wherein each block of electronic components for each pixel includes:
       an array of memory cells on the insulator layer over a Pwell;
       a driving circuit on the insulator layer over an Nwell and connected to an anode of a light emitting diode; and
       a logic circuit on the insulator layer connected between the array of the memory cells and the driving circuit, wherein the logic circuit includes P-type transistors on the Nwell and N-type transistors on the Pwell.

18. The structure of claim 17, further comprising:
Pwell contact regions on the Pwells;
Nwell contact regions on the Nwells; and
an additional Nwell in the semiconductor substrate below the Nwells and the Pwells,
wherein the additional Nwell isolates the Pwells from a lower portion of the semiconductor substrate.

19. The structure of claim 17, wherein the array of the memory cells includes:
a single column of the memory cells and multiple rows each with a single memory cell;
a first write bitline, a second write bitline, and a read bitline connected to all the memory cells in the single column; and
write wordlines and read wordlines including, for each row, a write wordline and a read wordline connected to the single memory cell in the row.

20. The structure of claim 19,
wherein the logic circuit in each block includes:
an input node connected to the read bitline;
a reset line;
a P-type transistor connected between a positive supply voltage rail and the input node;
three P-type transistors connected in series between the positive supply voltage rail and the input node;
three N-type transistors connected in series between the input node and ground; and
an inverter connected between the input node and an output node,
wherein the P-type transistor has a gate connected to the reset line, and
wherein the three P-type transistors and the three N-type transistors have gates connected to the output node; and
a NAND gate having inputs connected to the output node and to receive a pulse width modulation signal,
wherein a pulse width of the pulse width modulation signal depends on a pulse width of a read wordline select signal on a read wordline connected to a memory during a read operation directed to the memory cell,
wherein pulse widths of the read wordline select signals on the read wordlines increase progressively from row to row, and
wherein the driving circuit includes two additional P-type transistors connected in series between the positive supply voltage rail and the anode of the light emitting diode, wherein one of the two additional P-type transistors has a gate connected to an output of the NAND gate and another of the two additional P-type transistors has a gate connected to receive a gate bias voltage.

* * * * *